United States Patent
Shiau

(10) Patent No.: US 8,053,787 B2
(45) Date of Patent: Nov. 8, 2011

(54) LAMP SEAT FOR A LIGHT EMITTING DIODE AND CAPABLE OF HEAT DISSIPATION, AND METHOD OF MANUFACTURING THE SAME

(76) Inventor: Wen-Chin Shiau, Tao-Yuan Hsien (TW)

( * ) Notice: Subject to any disclaimer, the term of this patent is extended or adjusted under 35 U.S.C. 154(b) by 172 days.

(21) Appl. No.: 11/944,328

(22) Filed: Nov. 21, 2007

(65) Prior Publication Data

US 2009/0001558 A1 Jan. 1, 2009

(51) Int. Cl.
*H01L 27/15* (2006.01)

(52) U.S. Cl. ............. 257/81; 257/82; 257/99; 257/698; 257/699; 257/712; 257/E33.057; 257/E33.066; 257/E33.075; 438/122

(58) Field of Classification Search ........... 257/E33.057, 257/699, 698, 700, 712, E33.066, E33.075, 257/81, 82; 438/122
See application file for complete search history.

(56) References Cited

U.S. PATENT DOCUMENTS

| | | | |
|---|---|---|---|
| 2002/0070443 A1* | 6/2002 | Mu et al. | 257/712 |
| 2004/0195669 A1* | 10/2004 | Wilkins et al. | 257/698 |
| 2007/0029569 A1* | 2/2007 | Andrews | 257/99 |
| 2007/0133197 A1 | 6/2007 | Shiau | |
| 2007/0176193 A1* | 8/2007 | Nagai | 257/98 |
| 2007/0181993 A1* | 8/2007 | Choi et al. | 257/698 |

* cited by examiner

*Primary Examiner* — Thanh V Pham
*Assistant Examiner* — Maria Ligai
(74) *Attorney, Agent, or Firm* — McDermott Will & Emery LLP

(57) ABSTRACT

A lamp seat includes a metal substrate having opposite first and second surfaces, first and second conductive patterns formed on the first surface, and third and fourth conductive patterns formed on the second surface and connected respectively and integrally to the first and second conductive patterns. A heat-conductive first insulating layer is disposed between the metal substrate and each of the first, second, third and fourth conductive patterns. A heat-conductive second insulating layer is formed over the first insulating layer such that corresponding parts of the first and second conductive patterns are exposed outwardly of the second insulating layer for electrical connection with positive and negative electrodes of a light emitting diode, respectively.

7 Claims, 5 Drawing Sheets

LAMP SEAT FOR A LIGHT EMITTING DIODE AND CAPABLE OF HEAT DISSIPATION, AND METHOD OF MANUFACTURING THE SAME

CROSS-REFERENCE TO RELATED APPLICATION

This application claims priority of Taiwanese Application No. 096123483, filed on Jun. 28, 2007.

BACKGROUND OF THE INVENTION

1. Field of the Invention

The invention relates to a lamp seat, more particularly to a lamp seat adapted for a light emitting diode, and a method of manufacturing the same.

2. Description of the Related Art

A conventional flashlight is disclosed in U.S. Patent Application Publication No. 2007/0133197. In the conventional flashlight, a substrate formed with a metal layer thereon, a heat-dissipating plate and a heat-conductive casing are used for dissipating heat generated by a light emitting diode on a lamp seat. However, since the substrate and the heat-dissipating plate must be positioned to the lamp seat, an assembly of the lamp seat, the substrate and the heat-dissipating plate has a relatively large size.

SUMMARY OF THE INVENTION

Therefore, the object of the present invention is to provide a lamp seat adapted for a light emitting diode and capable of heat dissipation, and a method of manufacturing the same that can overcome the aforesaid drawback of the prior art.

According to one aspect of the present invention, there is provided a method of manufacturing a lamp seat for a light emitting diode. The method comprises the steps of:

a) providing a metal substrate having opposite first and second surfaces and formed with first and second through holes that extend from the first surface to the second surface and that are spaced apart from each other, the metal substrate further having first and second annular surrounding walls that define the first and second through holes, respectively;

b) forming a heat-conductive first insulating layer that has first, second and third layer portions disposed respectively over the first and second surfaces and the first annular surrounding wall of the metal substrate;

c) forming first and second conductive patterns on the first layer portion of the first insulating layer, forming third and fourth conductive patterns on the second layer portion of the first insulating layer, forming a first conductive layer over the third layer portion of the first insulating layer, and forming a second conductive layer on the second annular surrounding wall of the metal substrate such that the first and third conductive patterns are interconnected integrally and electrically via the first conductive layer and that the second and fourth conductive patterns are interconnected integrally and electrically via the second conductive layer; and d) forming a heat-conductive second insulating layer over the first layer portion of the first insulating layer such that corresponding parts of the first and second conductive patterns are exposed respectively via first and second openings in the second insulating layer so as to be connected electrically and respectively to positive and negative electrodes of the light emitting diode.

According to another aspect of the present invention, there is provided a lamp seat adapted for a light emitting diode. The lamp seat comprises:

a metal substrate having opposite first and second surfaces and formed with first and second through holes that extend from the first surface to the second surface and that are spaced apart from each other, the metal substrate further having first and second annular surrounding walls that define the first and second through holes, respectively;

a heat-conductive first insulating layer having first, second and third layer portions formed respectively over the first and second surfaces and the first annular surrounding wall of the metal substrate;

first and second conductive patterns formed on the first layer portion of the first insulating layer;

third and fourth conductive patterns formed on the second layer portion of the first insulating layer;

a first conductive layer disposed in the first through hole in the metal substrate, formed over the third layer portion of the first insulating layer, and interconnecting integrally and electrically the first and third conductive patterns;

a second conductive layer disposed in the second through hole in the metal substrate, formed on the second annular surrounding wall of the metal substrate, and interconnecting integrally and electrically the second and fourth conductive patterns; and a heat-conductive second insulating layers having first and second openings and formed over the first layer portion of the first insulating layer such that corresponding parts of the first and second conductive patterns are exposed respectively via the first and second openings and are adapted to be connected electrically and respectively to positive and negative electrodes of the light emitting diode.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
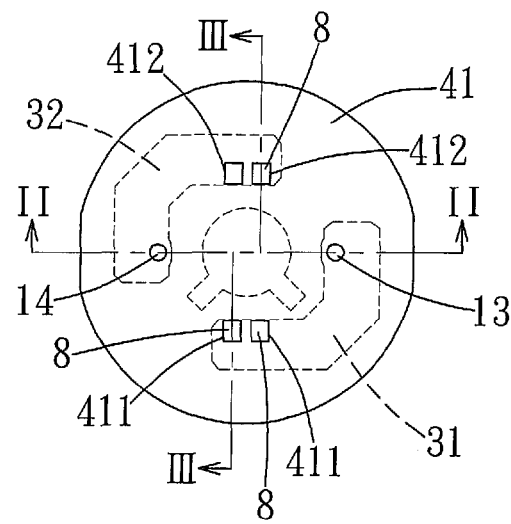
FIG. 1 is a schematic top view showing the first preferred embodiment of a lamp seat according to the present invention.

Before the present invention is described in greater detail, it should be noted that like elements are denoted by the same reference numerals throughout the disclosure.

Referring to FIGS. 1 to 4, and 8, the first preferred embodiment of a lamp seat adapted for a light emitting diode (LED) 5 according to the present invention is shown to include a metal substrate 1, first, second, third and fourth insulating layers 2, 41, 24, 42, first, second, third and fourth conductive patterns 31, 32, 33, 34, and first and second conductive layers 35, 36. In this embodiment, the LED 5 is of high power, such as 5 watts, such that dissipation of heat generated by the LED 5 is necessary.

Figure 2:
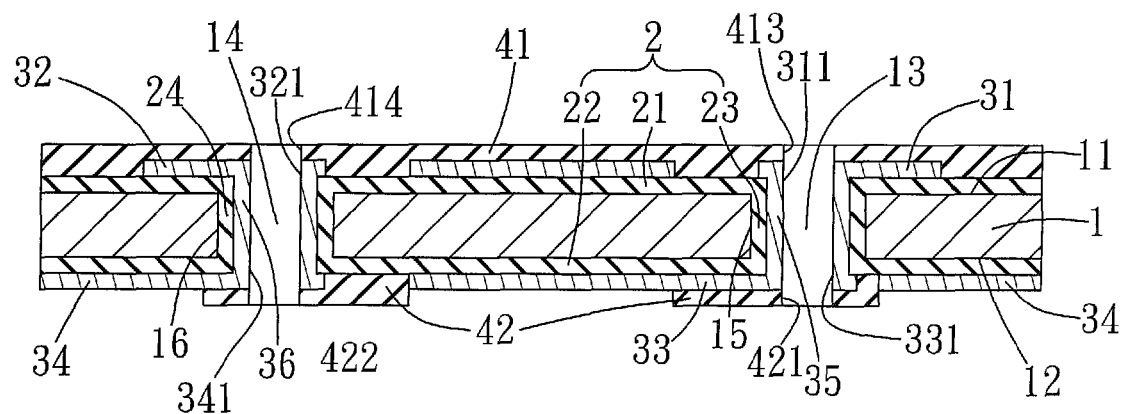
FIG. 2 is a schematic sectional view of FIG. 1 taken along line II-II.
Figure 5:
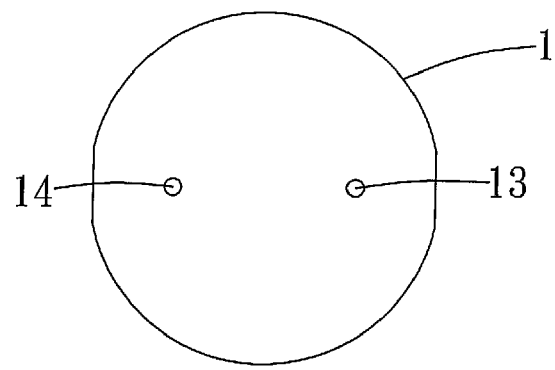
FIG. 5 is a schematic view showing a metal substrate of the first preferred embodiment.

The metal substrate 1 is made of aluminum, has opposite first and second surfaces 11, 12, and is formed with first and second through holes 13, 14 that extend from the first surface 11 to the second surface 12 and that are spaced apart from each other (see FIG. 5). The metal substrate 1 further has first and second annular surrounding walls 15, 16 that define the first and second through holes 13, 14, respectively, as shown in FIG. 2.

The first insulating layer 2 is heat-conductive and is made of epoxy resin. In this embodiment, the first insulating layer 2 has first, second and third layer portions 21, 22, 23 formed respectively over the first and second surfaces 11, 12 and the first annular surrounding wall 15 of the metal substrate 1, as shown in FIG. 2.

The third insulating layer 24 is heat-conductive and is made of epoxy resin. The third insulating layer 24 is formed over the second annular surrounding wall 16 of the metal substrate 1, is sandwiched between the second annular surrounding wall 16 and the second conductive layer 36, and interconnects integrally the first and second layer portions 21, 22 of the first insulating layer 2, as shown in FIG. 2.

Figure 6:
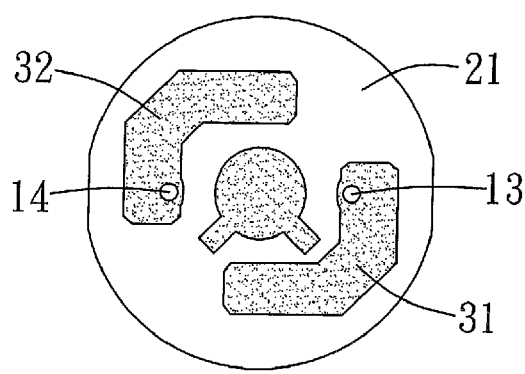
FIG. 6 is a schematic top view showing the first preferred embodiment, wherein a heat-conductive second insulating layer is removed.
Figure 7:
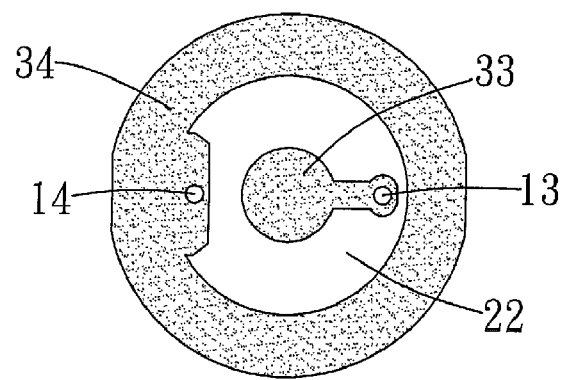
FIG. 7 is a schematic bottom view showing the first preferred embodiment, wherein a heat-conductive fourth insulating layer is removed.

Referring further to FIG. 6, in this embodiment, the first and second conductive patterns 31, 32 are made of copper, and are formed on the first layer portion 21 of the first insulating layer 2. It is noted that the first conductive pattern 31 has an opening 311 aligned with the first through hole 13 in the metal substrate 1, while the second conductive pattern 32 has an opening 321 aligned with the second through hole 14 in the metal substrate 1, as shown in FIG. 2. Referring further to FIG. 7, in this embodiment, the third and fourth conductive patterns 33, 34 are made of copper, and are formed on the second layer portion 22 of the first insulating layer 2. It is noted that the third conductive pattern 33 has an opening 331 aligned with the first through hole 13 in the metal substrate 1, while the fourth conductive pattern 34 has an opening 341 aligned with the second through hole 14 in the metal substrate 1, as shown in FIG. 2.

The first conductive layer 35 is made of copper, is disposed in the first through hole 13 in the metal substrate 1, and is formed over the third layer portion 23 of the first insulating layer 2. The first conductive layer 35 interconnects integrally and electrically the first and third conductive patterns 31, 33, as shown in FIG. 2.

The second conductive layer 36 is made of copper, is disposed in the second through hole 14 in the metal substrate 1, and is formed over the third insulating layer 24. The second conductive layer 36 interconnects integrally and electrically the second and fourth conductive patterns 32, 34.

Figure 3:
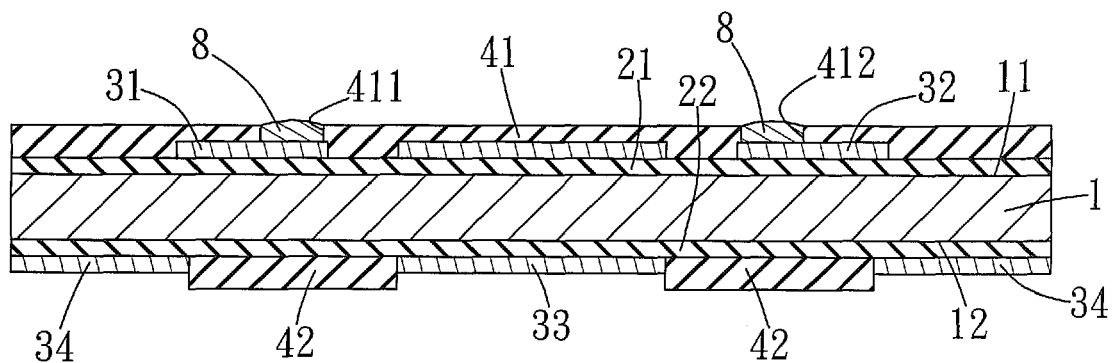
FIG. 3 is a schematic sectional view of FIG. 1 taken along line III-III.

The second insulating layer 41 is heat-conductive and is made of epoxy resin. The second insulating layer 41 is formed over the first layer portion 21 of the first insulating layer 2. In this embodiment, the second insulating layer 41 has two first openings 411 corresponding to the first conductive pattern 31, and two second openings 412 corresponding to the second conductive pattern 32 such that corresponding parts of the first and second conductive patterns 31, 32 are exposed respectively via the first and second openings 411, 412, as shown in FIG. 3. In this embodiment, the second insulating layer 41 further has third and fourth openings 413, 414 aligned respectively with the first and second through holes 13, 14 in the metal substrate 1 (see FIG. 2).

Figure 4:
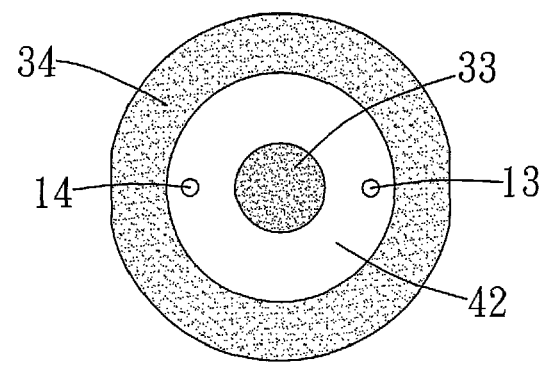
FIG. 4 is a schematic bottom view showing the first preferred embodiment.

The fourth insulating layer 42 is heat-conductive and is made of epoxy resin. The fourth insulating layer 42 is formed over the second layer portion 22 of the first insulating layer 2 such that a portion of the third conductive pattern 33 and a portion of the fourth conductive pattern 34 are exposed outwardly of the fourth insulating layer 42. In this embodiment, the exposed portion of the third conductive pattern 33 is circular and is disposed at a central portion of the second surface 12 of the metal substrate 1, where as the exposed portion of the fourth conductive pattern 34 is ring-shaped and is disposed around the exposed portion of the third conductive pattern 33, as shown in FIG. 4. Further, the fourth insulating layer 42 has two openings 421, 422 aligned respectively with the first and second through holes 13, 14 in the metal substrate 1 (see FIG. 2).

Figure 8:
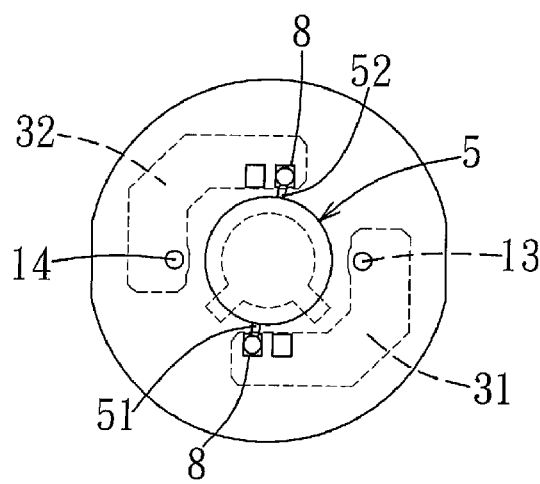
FIG. 8 is a schematic top view showing the first preferred embodiment mounted with a light emitting diode.

In this embodiment, the lamp seat further includes four conductive pads 8 disposed respectively in the first and second openings 411, 412 in the second insulating layer 41 and connected electrically and respectively to the corresponding parts of the first and second conductive patterns 31, 32. Hence, as shown in FIG. 8, when the LED 5 is mounted on the lamp seat, two pins 51, 52 of the LED 5 serve respectively as positive and negative electrodes, and are connected electrically and respectively to the corresponding part of the first conductive pattern 31 and the corresponding part of the second conductive pattern 32 via two corresponding pads 8. In such a configuration, heat generated by the LED 5 can be transmitted to the lamp seat.

Figure 9:
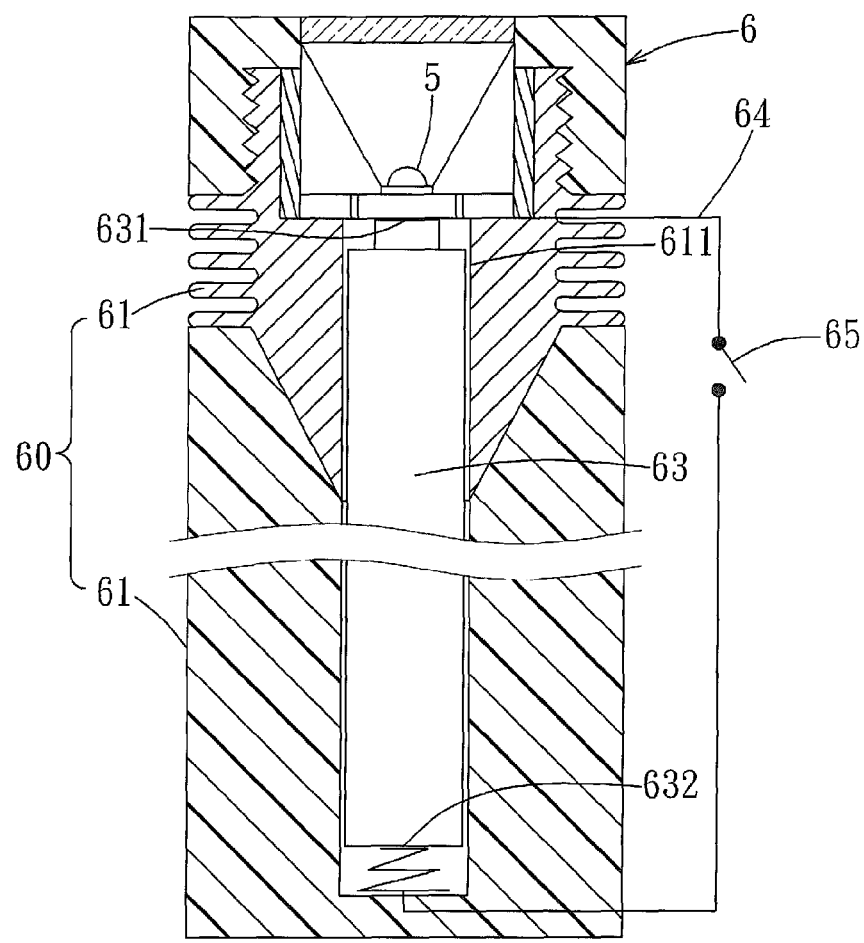
FIG. 9 is a partly sectional schematic view showing the first preferred embodiment embodied in a flashlight.

Referring further to FIG. 9, the lamp seat mounted with the LED 5 is embodied in a flashlight 6. The flashlight 6 includes a housing 60 having a conductive end portion 61 and an insulating end portion 62, and a battery 63 disposed in the housing 60. The lamp seat is disposed in the conductive end portion 61 of the housing 60 such that the exposed portion of the third conductive pattern 33 contacts directly and electrically a positive electrode 631 of the battery 63, and that the exposed portion of the fourth conductive pattern 34 contacts electrically an inner annular surrounding wall 611 of the conductive end portion 61 of the housing 60 and is connected electrically to a negative electrode 632 of the battery via a wire 64 and a switch 65. As a result, heat generated by the LED 5 is further transmitted to the conductive end portion 61 of the battery housing 60 via the fourth conductive pattern 34.

In sum, since the lamp seat of the present invention has a laminated heat-conductive structure, the lamp seat has a compact size.

Figure 10:
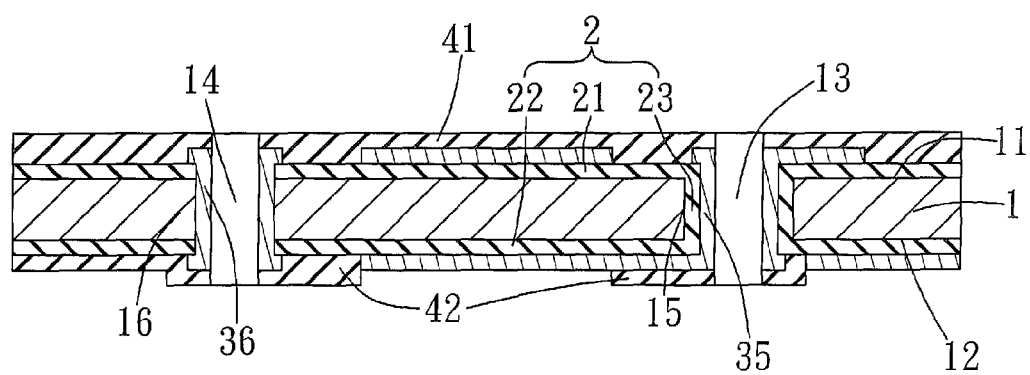
FIG. 10 is a schematic sectional view showing the second preferred embodiment of a lamp seat according to the present invention.

FIG. 10 illustrates the second preferred embodiment of a lamp seat according to this invention, which is a modification of the first preferred embodiment. In this embodiment, the third insulating layer 24 in the first preferred embodiment of FIG. 2 is omitted, i.e., the second conductive layer 36 is formed directly over the second annular surrounding wall 16.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A lamp seat adapted for a light emitting diode, comprising:
 a metal substrate having opposite first and second surfaces and formed with first and second through holes that extend from said first surface to said second surface and that are spaced apart from each other, said metal substrate further having first and second annular surrounding walls that define said first and second through holes, respectively;
 a heat-conductive first insulating layer having first, second and third layer portions that are formed respectively over said first and second surfaces and said first annular surrounding wall of said metal substrate;
 first and second conductive patterns formed on said first layer portion of said first insulating layer;
 third and fourth conductive patterns formed on said second layer portion of said first insulating layer;
 a first conductive layer disposed in said first through hole in said metal substrate, formed over said third layer portion of said first insulating layer, and interconnecting integrally and electrically said first and third conductive patterns;
 a second conductive layer disposed in said second through hole in said metal substrate, formed on said second annular surrounding wall of said metal substrate, and interconnecting integrally and electrically said second and fourth conductive patterns; and
 a heat-conductive second insulating layer having first and second openings and formed over said first layer portion of said first insulating layer such that corresponding parts of said first and second conductive patterns are exposed respectively via said first and second openings and are adapted to be connected electrically and respectively to positive and negative electrodes of the light emitting diode;
 a heat-conductive third insulating layer formed over said second annular surrounding wall of said metal substrate such that said third insulating layer is sandwiched between said second annular surrounding wall of said metal substrate and said second conductive layer, and interconnects integrally said first and second layer portions of said first insulating layer; and
 a heat-conductive fourth insulating layer formed over said second layer portion of said first insulating layer such that a portion of said third conductive pattern and a portion of said fourth conductive pattern are exposed outwardly of said fourth insulating layer without extending through said fourth insulating layer, are spaced apart from said first and second through holes in said metal substrate and are adapted for heat transmission and electrical connection with an external power source.

2. The lamp seat as claimed in claim 1, wherein said metal substrate is made of aluminum.

3. The lamp seat as claimed in claim 1, wherein said first, second, third and fourth conductive patterns, and said first and second conductive layers are made of copper.

4. The lamp seat as claimed in claim 1, wherein said first and second insulating layers are made of epoxy resin.

5. The lamp seat as claimed in claim 1, wherein said exposed portion of said third conductive pattern is circular and is disposed at a central portion of said second surface of said metal substrate.

6. The lamp seat as claimed in claim 5, wherein said exposed portion of said fourth conductive pattern is ring-shaped and is disposed around said exposed portion of said third conductive pattern.

7. The lamp seat as claimed in claim 1, further comprising two conductive pads disposed respectively in said first and second openings in said second insulating layer and connected electrically and respectively to said corresponding parts of said first and second conductive patterns such that the positive and negative electrodes of the light emitting diode are connected electrically and respectively to said first and second conductive patterns via said conductive pads.

* * * * *